United States Patent [19]

Shigetomo et al.

[11] Patent Number: 5,565,008
[45] Date of Patent: Oct. 15, 1996

[54] PROCESS OF RAISING A SEMICONDUCTOR DEVICE OUT OF A PALLET USING A POSITIONING ROD

[75] Inventors: Kunihiro Shigetomo; Jiro Takamura; Kunio Kobayashi; Kiyoji Imanaka, all of Itami, Japan

[73] Assignee: Mitsubishi Denki Kabushiki Kaisha, Tokyo, Japan

[21] Appl. No.: 234,595

[22] Filed: Apr. 28, 1994

Related U.S. Application Data

[63] Continuation of Ser. No. 10,457, Jan. 27, 1993, abandoned, which is a continuation of Ser. No. 729,399, Jul. 12, 1991, abandoned.

[30] Foreign Application Priority Data

Jul. 17, 1990 [JP] Japan ................................. 2-191648
Jun. 14, 1991 [JP] Japan ................................. 3-143318

[51] Int. Cl.$^6$ ........................... H01L 21/58; H01L 21/68
[52] U.S. Cl. ..................... 29/25.01; 437/212; 437/925
[58] Field of Search ............................ 414/940, 416, 414/417; 198/803.12, 692, 699.1; 206/328, 329, 330, 331, 332, 562; 437/212, 216, 222; 29/25.01, 925; 269/903

[56] References Cited

U.S. PATENT DOCUMENTS

| | | | |
|---|---|---|---|
| 3,184,054 | 5/1965 | Kuhlman | 206/56 |
| 3,589,938 | 6/1971 | Blewitt et al. | 437/925 |
| 3,668,750 | 6/1972 | McAllister et al. | 29/25.01 |
| 3,868,759 | 3/1975 | Hartleroad et al. | 29/464 |
| 3,868,765 | 3/1975 | Hartleroad et al. | 29/740 |
| 3,887,996 | 6/1975 | Hartleroad et al. | 29/583 |
| 3,887,997 | 6/1975 | Hartleroad et al. | 29/589 |
| 3,887,998 | 6/1975 | Hartleroad et al. | 29/740 |
| 3,912,153 | 10/1975 | Hartleroad et al. | 228/254 |
| 3,937,386 | 2/1976 | Hartleroad et al. | 228/180 |
| 3,978,579 | 9/1976 | Checki, Jr. et al. | 437/925 |
| 4,227,289 | 10/1980 | Avalon et al. | 29/33 K |
| 4,289,922 | 9/1981 | Devlin | 174/52 FP |
| 4,461,525 | 7/1984 | Griffin | 339/75 M |
| 4,718,548 | 1/1988 | Estrada et al. | 206/329 |
| 4,776,080 | 10/1988 | Christensen | 269/903 |
| 4,898,275 | 2/1990 | Skrtic et al. | 206/330 |
| 4,949,159 | 8/1990 | Petry, Jr. et al. | 357/70 |
| 5,035,034 | 7/1991 | Cotney | 29/25.01 |
| 5,042,123 | 8/1991 | Mori | 29/25.01 |

FOREIGN PATENT DOCUMENTS

| | | | |
|---|---|---|---|
| 216286 | 4/1987 | European Pat. Off. | 29/25.01 |
| 227968 | 7/1987 | European Pat. Off. | 437/925 |
| 56-67768 | 6/1981 | Japan | 29/740 |
| 58-105549 | 6/1983 | Japan | 29/25.01 |
| 58-127342 | 7/1983 | Japan | 29/25.01 |
| 58-111339 | 7/1983 | Japan | 29/25.01 |
| 58-209128 | 12/1983 | Japan | 29/25.01 |
| 59-88840 | 5/1984 | Japan | 29/25.01 |
| 61-56429 | 3/1986 | Japan | 437/925 |
| 61-67239 | 4/1986 | Japan | 437/925 |
| 62-272551 | 11/1987 | Japan | 437/925 |
| 1258499 | 10/1989 | Japan | 29/740 |
| 219266 | 1/1990 | Japan | 206/328 |

*Primary Examiner*—John Niebling
*Assistant Examiner*—David E. Graybill
*Attorney, Agent, or Firm*—Leydig, Voit & Mayer

[57] ABSTRACT

A method of manufacturing semiconductor devices includes accommodating the semiconductor devices in the form of semimanufactures in accomodating tools having uniform outer dimensions regardless of the type of the semiconductor devices; receiving the semiconductor devices in the form of semimanufactures in each of a plurality of processing devices while maintaining the semiconductor devices in the accomodating tools; and processing the semiconductor devices in the form of semimanufactures in each of a plurality of processing devices.

24 Claims, 12 Drawing Sheets

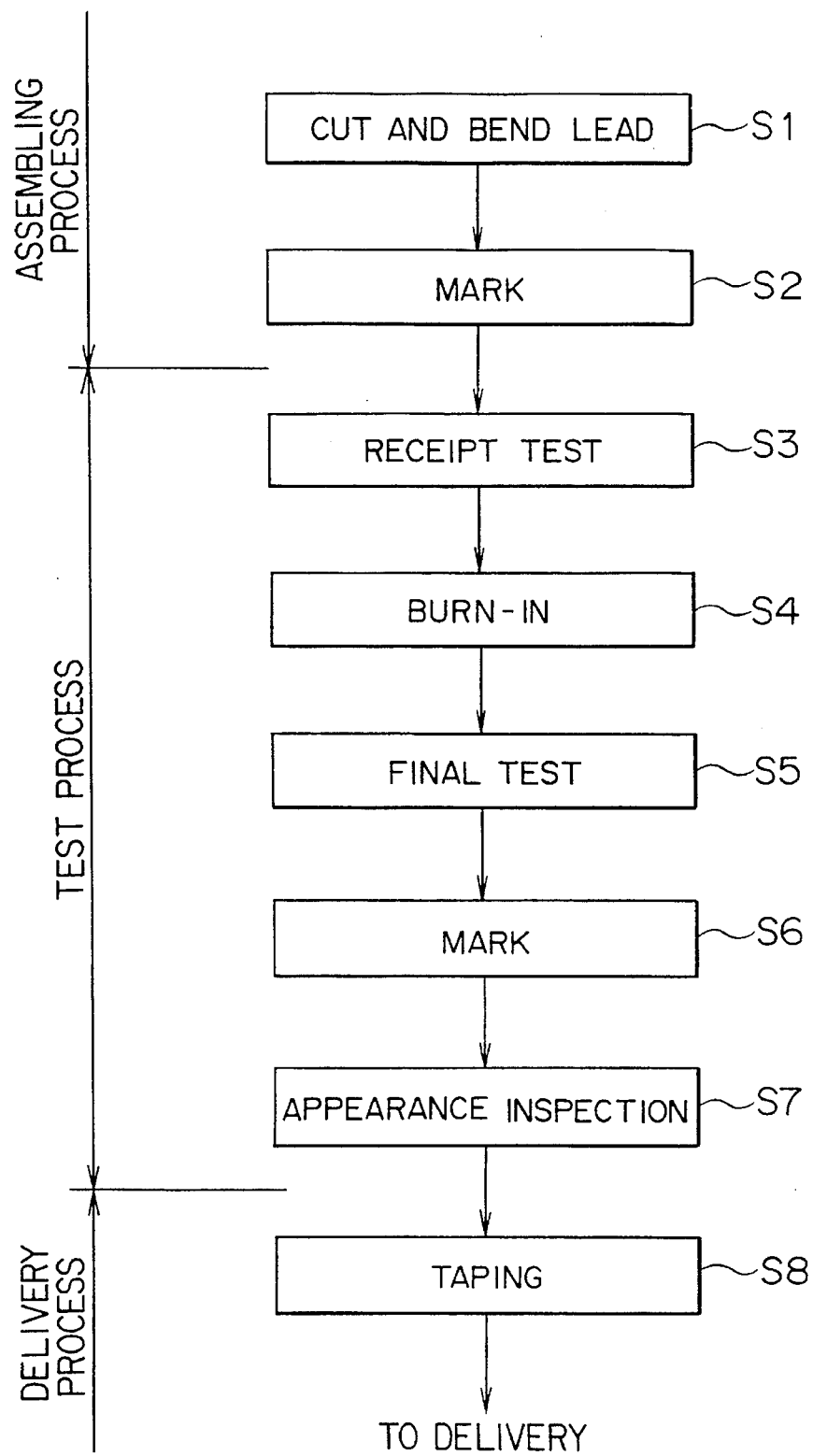

# 5,565,008

PROCESS OF RAISING A SEMICONDUCTOR DEVICE OUT OF A PALLET USING A POSITIONING ROD

This disclosure is a continuation of application Ser. No. 08/010,457, filed Jan. 27, 1993, abandoned, which is, itself a continuation of application Ser. No. 07/729,399, filed Jul. 12, 1991, now abandoned.

BACKGROUND OF THE INVENTION

1. Field of the Invention

The present invention relates to a method and an apparatus for manufacturing semiconductor devices, and, more particularly, to a method and apparatus for use in a portion of the overall process for manufacturing semiconductor devices such as ICs, the portion of the overall process being a process in which the semiconductor devices are treated as semimanufactures.

2. Description of the Related Art

An example of a portion of the overall process for manufacturing ICs in which the ICs are treated as semi-manufactures is shown in FIG. 16. First, ICs are packaged in an assembling process before they are, in step S1, subjected to a lead cutting and bending process and the ICs are then subjected to a marking process in step S2. Thus, the assembling process is completed. In a test process performed after the assembling process, a receipt test is carried out in step S3, a burn-in process is performed in step S4, a final test is performed in step S5, a marking process is performed in step S6 and an appearance inspection is performed in step S7. After the above-described test processes have been sequentially performed, a delivery process is commenced so that taping of the ICs is performed in step S8 before the ICs are delivered.

Apparatus for performing the above-described processes will now be described with reference to FIG. 17. In the lead cutting and bending process, a lead processing machine 1 cuts and bends outer leads. In the next process, the model name, the trade mark and the lot number and the like of the IC are printed or stamped onto the surface of each of the ICs by a marking machine 2. The receipt test of the test process is performed by a test handler 3 and a tester 4. The burn-in process is arranged in such a manner that the IC is inserted into a burn-in substrate by an IC inserting machine 5. Then, an electric stress is given to the IC in a high temperature environment by a burn-in device 6 before the IC is finally removed from the burn-in substrate by an IC pulling-out machine 7. The final test is performed by using a test handler 8 and a tester 9 before the marking of the model name, the trade mark and the lot number or the like onto the surface of the IC, which has been subjected to the test, is performed by using a marking machine 10. Then, appearance factors such as the state of the marks on the IC and how the outer leads are bent and the like are inspected by using an appearance inspecting machine 11. The taping operation performed in the delivery process is performed by a taping machine 12. As described above, the ICs are treated by a multiplicity of processing devices as semimanufactures in the IC manufacturing process.

With increasing density of integration of ICs, the package contours have been varied significantly. Accordingly, a variety of IC accommodating tools for conveying the ICs from the processing device in the previous stage to set them to the ensuing processing device have been developed. For example, a DIP IC 13 shown in FIG. 18 and an SOP IC 14 shown in FIG. 19 are accommodated in tubes 16 structured as shown in FIG. 20. On the other hand, a QFP IC 15 shown in FIG. 21 is accommodated on a tray 17 arranged as shown in FIG. 22. Since there are a variety of IC packages and a special accommodating tool, selected depending upon the size of the ICs and the number of the outer leads must be used, the accommodating tools excessively increase in number.

Since the ICs are set to each of the processing devices shown in FIG. 17 in a unit of the accommodating tools, each of the processing devices is formed into an exclusive structure to adapt to the special accommodating tool. Therefore, the processing devices cannot be adapted to a variety of accommodating tools. That is, there arises a problem in that a change of IC packages in the subject stage cannot be performed in an actual fact and therefore a multiplicity of processing devices must be prepared to correspond to the various packages.

SUMMARY OF THE INVENTION

Accordingly, an object of the present invention is to provide a method and an apparatus for manufacturing semiconductors capable of easily changing the semiconductor device packages in the same process and exhibiting a wide applicability to a variety of the packages.

In order to achieve the above-object, according to one aspect of the present invention, there is provided a method of manufacturing semiconductor devices in the form of products by processing the semiconductor devices in the form of semimanufactures by using a plurality of processing devices, the method comprising the steps of: accommodating the semiconductor devices in the form of semimanufactures in accommodating tools having unified outer dimensions regardless of the type of the semiconductors; receiving the semiconductor devices in the form of semimanufactures by each of the processing devices while maintaining a state where the semiconductor devices are accommodated in the accommodating tools; and processing the semiconductor devices in the form of semimanufactures in each of the processing devices.

According to another aspect of the present invention, there is provided an apparatus for manufacturing semiconductor devices comprising: accommodating tools having unified outer dimensions regardless of the type of the semiconductor devices for accommodating the semiconductor device in the form of semimanufactures; and a plurality of processing devices for processing the semiconductor devices in the form of semimanufactures received from the accommodated tools and for discharging the semiconductor devices by using the accommodating tools.

BRIEF DESCRIPTION OF THE DRAWINGS

FIG. 16 illustrates a portion of the process for manufacturing ICs in which the ICs are treated as semimanufactures;

DESCRIPTION OF THE PREFERRED EMBODIMENTS

Preferred embodiments of the present invention will now be described with reference to the accompanying drawings.

Figure 1:
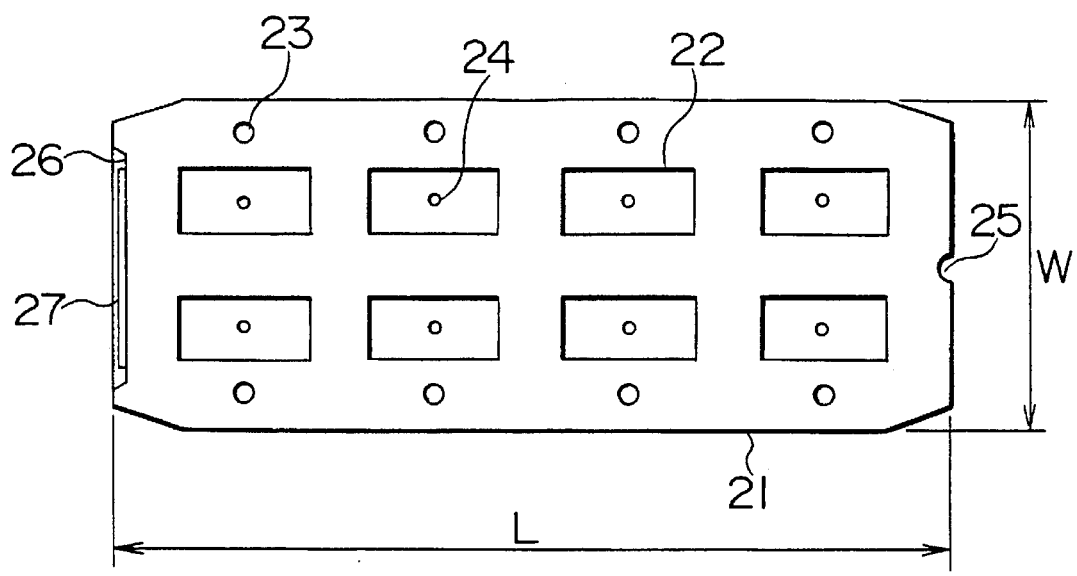
FIG. 1 is a plan view which illustrates a pallet for use in a method of manufacturing semiconductor devices according to a first embodiment of the present invention.
Figure 2:
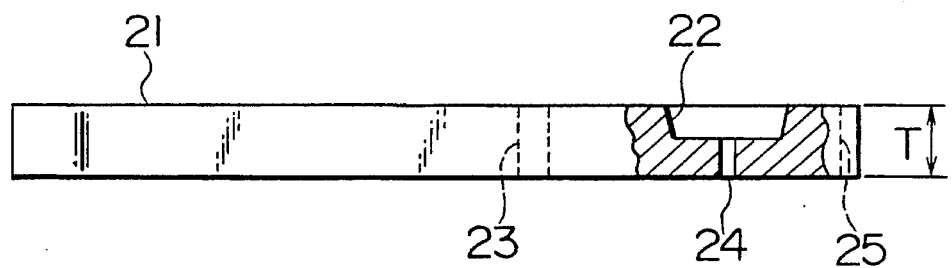
FIG. 2 is a partially broken side elevational view which illustrates the pallet shown in FIG. 1.

FIGS. 1 and 2 respectively illustrate a pallet 21 serving as an IC accommodating tool for use in a method of manufacturing semiconductor devices according to a first embodiment of the present invention. The pallet 21 is formed into a substantially rectangular plate-like shape having length L, width W and thickness T. The pallet 21 has, on the surface thereof, a plurality of pockets 22 formed for the purpose of accommodating ICs. Positioning holes 23 are formed on the two side peripheral portions of the pallet 21, the positioning holes 23 being disposed on a line drawn through centers of two of the pockets 22. Each of the pockets 22 has an IC detection hole 24 formed therein, the IC detection hole 24 disposed on the above-described line drawn through the centers of the pockets 22, that is, at the same position as the positioning hole 23 when viewed in the lengthwise direction of the pallet 21. The positioning holes 23 are, in the processing device, mainly used to position the pallet 21, while each of the IC detection holes 24 is used to detect whether or not the IC is present in the subject pocket 22. The pallet 21 has a cut portion 25 used to display and detect the direction of the pallet 21, the cut portion 25 being formed at an end portion of the pallet 21. On the other hand, a wide cut portion 26 is formed in another end portion of the pallet 21, the cut portion 26 including a label 27 applied thereto which shows information about the type of the ICs to be accommodated in the pallet 21, that is, the label 27 is a bar code label.

The pocket 22 of the pallet 21 is arranged to adapt to an IC formed into a special package, necessitating corresponding pallets for the types of the ICs to be manufactured. However, the outer dimensions of the pallet 21, that is, length L, width W and thickness T are respectively arranged to be unified values regardless of the type of the ICs to be accommodated. Furthermore, it is preferable that the position of each of the positioning holes 23 and the IC detection holes 24 be set to unified positions.

Figure 3:
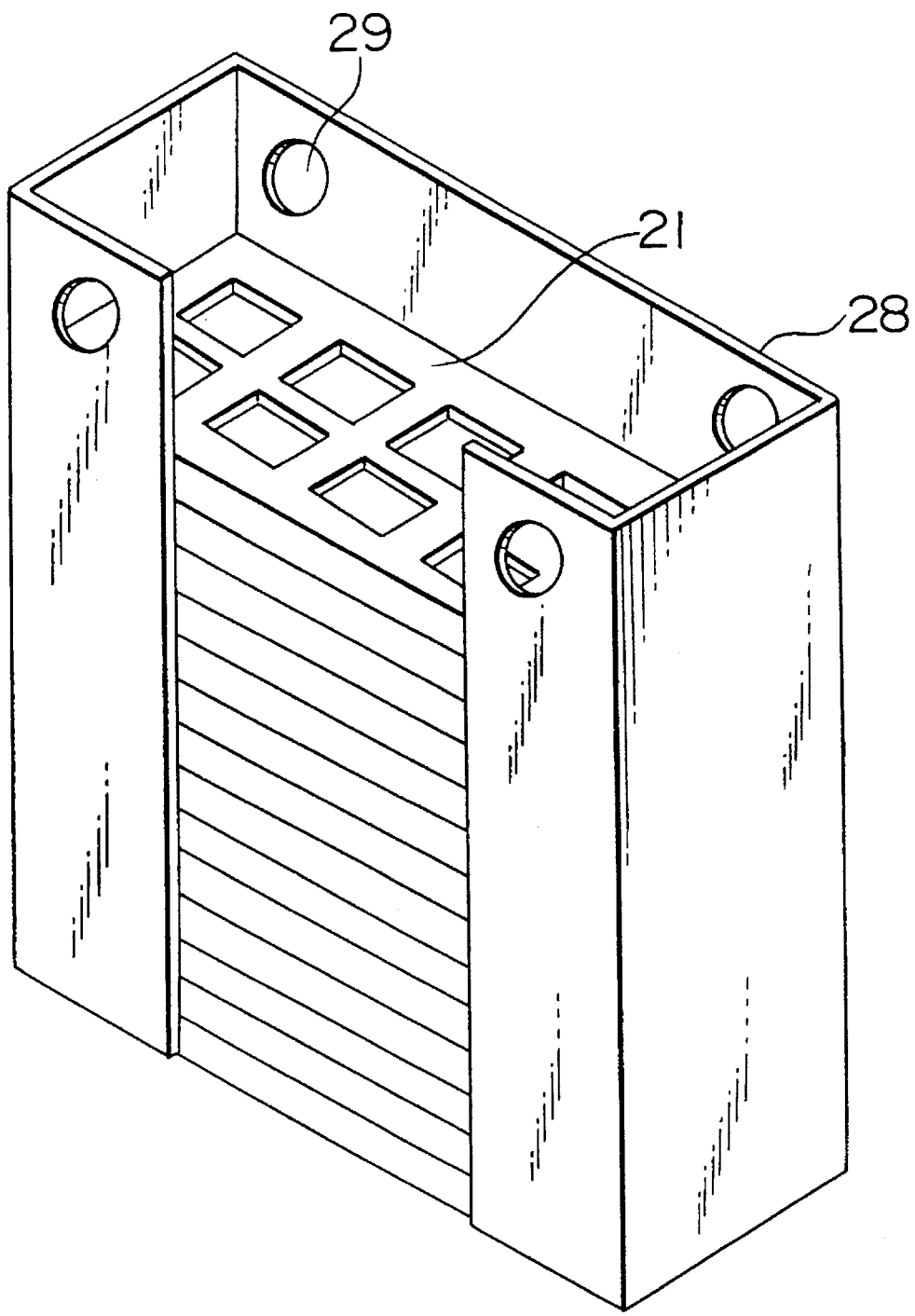
FIG. 3 is a perspective view which illustrates a cassette for use in a manufacturing method according to the first embodiment of the present invention.

A plurality of the pallets 21, which respectively accommodate the ICs, are accommodated in a cassette 28 arranged as shown in FIG. 3. By using the cassette 28, the ICs can be conveyed within the processing device and they can be conveyed from a certain processing device to the next processing device. The cassette 28 has cut portions 29 acting when the cassette 28 is conveyed, the cut portions 29 enabling the manual or automatic conveyance of the cassette 28 to be performed. As an alternative to the cut portions 29, handles may be formed.

Figure 4:
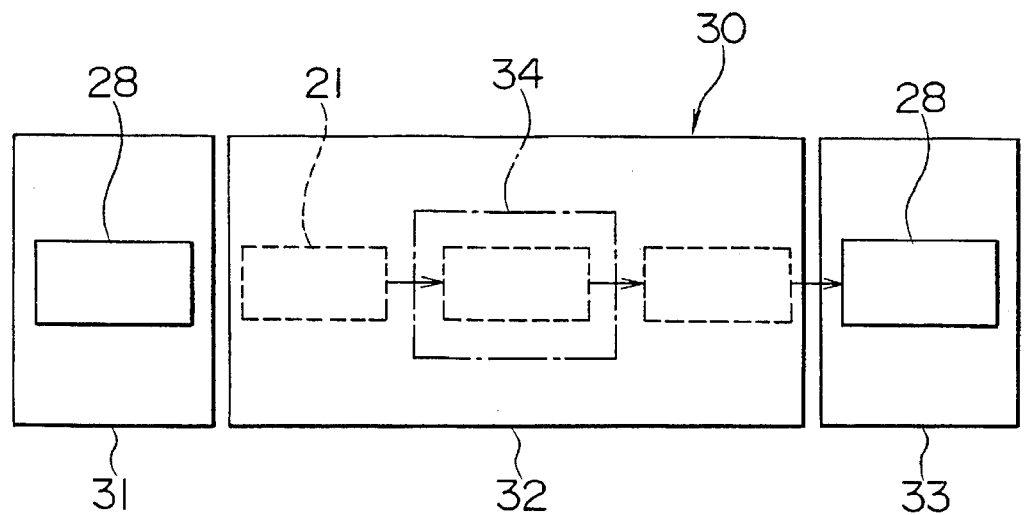
FIG. 4 is a schematic view which illustrates a manufacturing method according to the first embodiment of the present invention.
Figure 17:
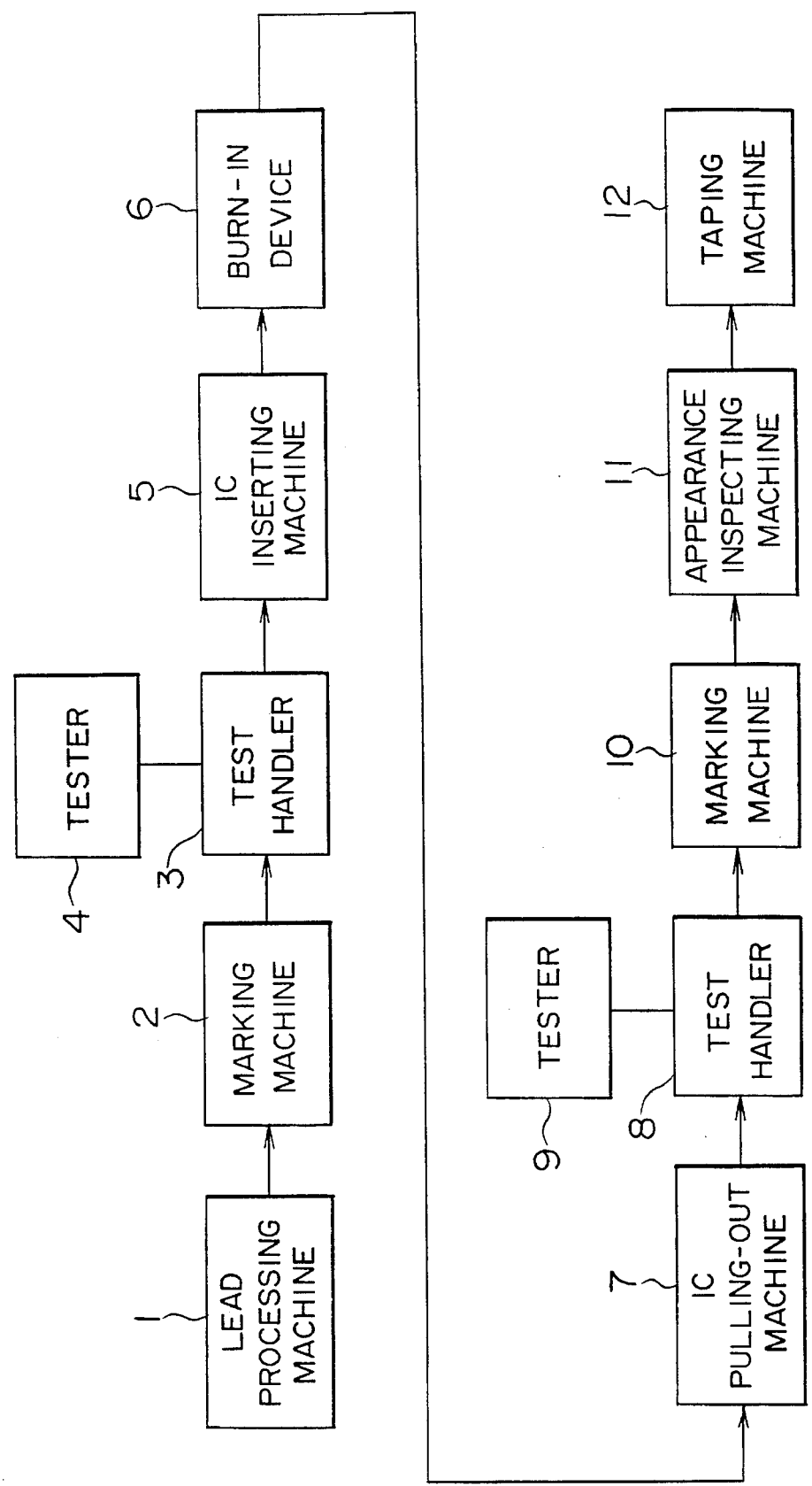
FIG. 17 is a block diagram which illustrates processing devices for performing the processes shown in FIG. 16.
Figure 18:
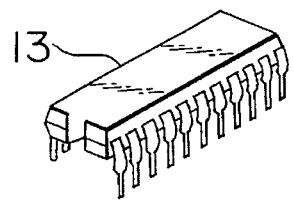
FIG. 18 is a perspective view which illustrates a DIP IC.
Figure 19:
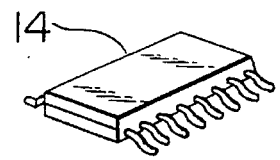
FIG. 19 is a perspective view which illustrates an SOP IC.
Figure 20:
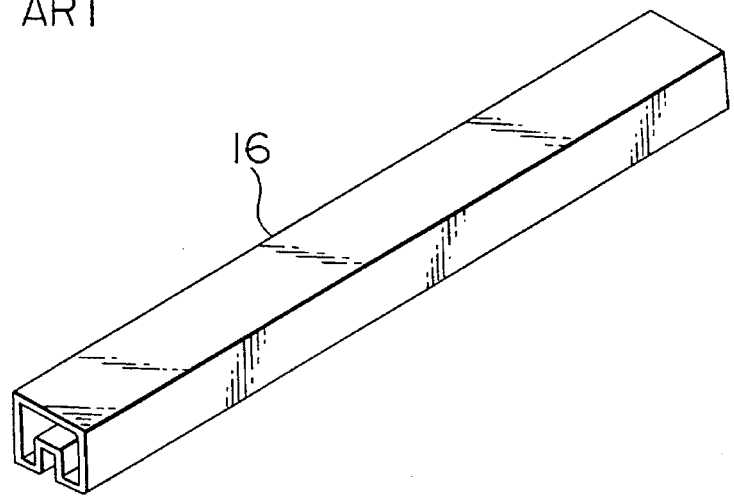
FIG. 20 is a perspective view which illustrates a tube.
Figure 21:
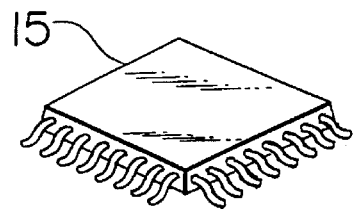
FIG. 21 is a perspective view which illustrates a QFP IC.
Figure 22:
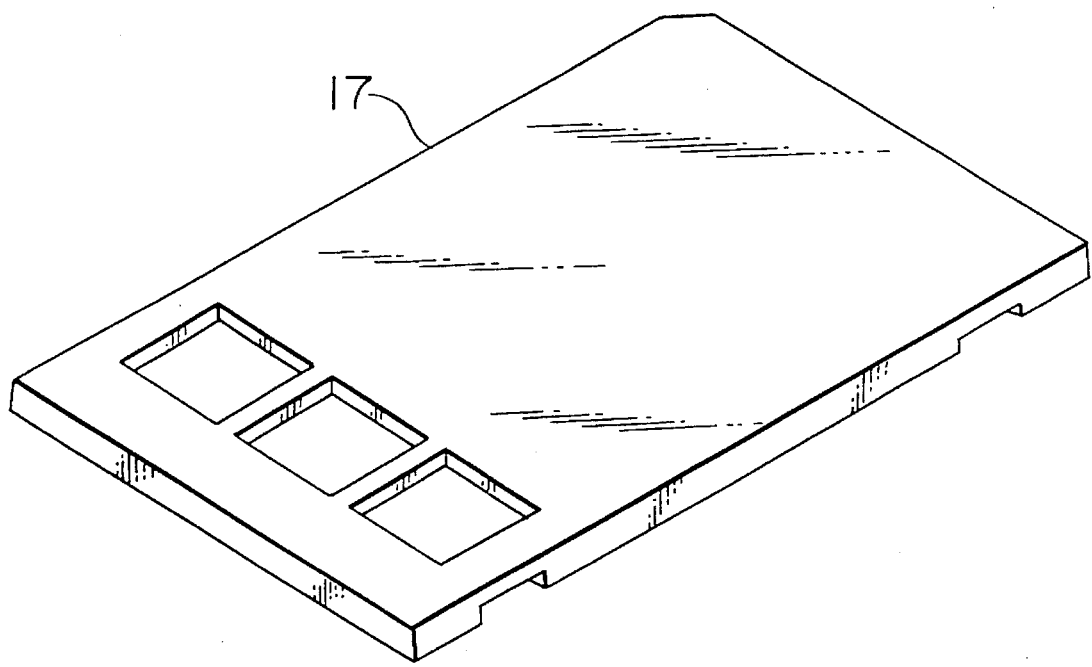
FIG. 22 is a perspective view which illustrates a tray.

Then, a method of manufacturing semiconductor devices according to an embodiment of the present invention will now be described with reference to FIG. 4. FIG. 4 illustrates one processing device 30 among a series of processing devices arranged to treat the ICs in the form of semimanufactures as shown in FIG. 17. The processing device 30 is constituted by a body portion 32 including a processing portion 34 for processing the IC, a supply portion 31 for supplying the IC to the body portion 32 and a discharge portion 33 for discharging the IC which has been processed in the body portion 32. First, a plurality of pallets 21 having pockets 22, each of which accommodates the IC in the form of semimanufactures, are accommodated in the cassette 28, the cassette 28 being then supplied to the supply portion 31. The supply portion 31 receives one pallet 21 from the supplied cassette 28 so as to convey it to the body portion 32. The pallet 21 is then conveyed in the body portion 32 until it reaches the processing portion 34 at which the IC accommodated in each of the pockets 22 of the pallet 21 is then subjected to a predetermined process. At this time, the ICs may be removed from the pallet 21 by an IC removal device (omitted from illustration) to be subjected to the process before the ICs are returned to the pockets 22 of the pallet 21. As an alternative to this, the ICs may be subjected to the process while being maintained in the pockets 22 of the pallet 21. After processing of all of the ICs accommodated in the pallet 21 has been completed, the pallet 21 is conveyed from the body portion 32 to the discharge portion 33 at which the pallet 21 is stored in an empty cassette 28. Similarly, all of the pallets 21 in the cassette 28 received by the supply portion 31 are sequentially conveyed to the body portion 32 so that the ICs are processed. Then, the pallets 21 are stored in the cassette 28 in the discharge portion 33.

Figure 5:
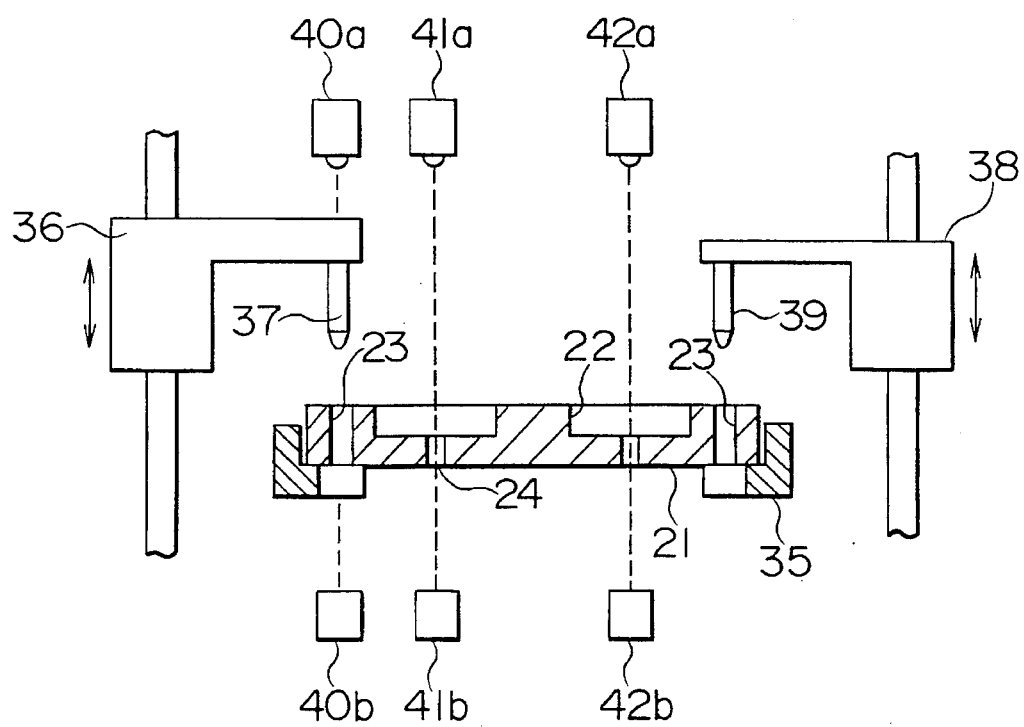
FIGS. 5 and 6 respectively are a cross sectional view and a plan view which illustrate a means for conveying the pallet according to the first embodiment of the present invention.
Figure 6:
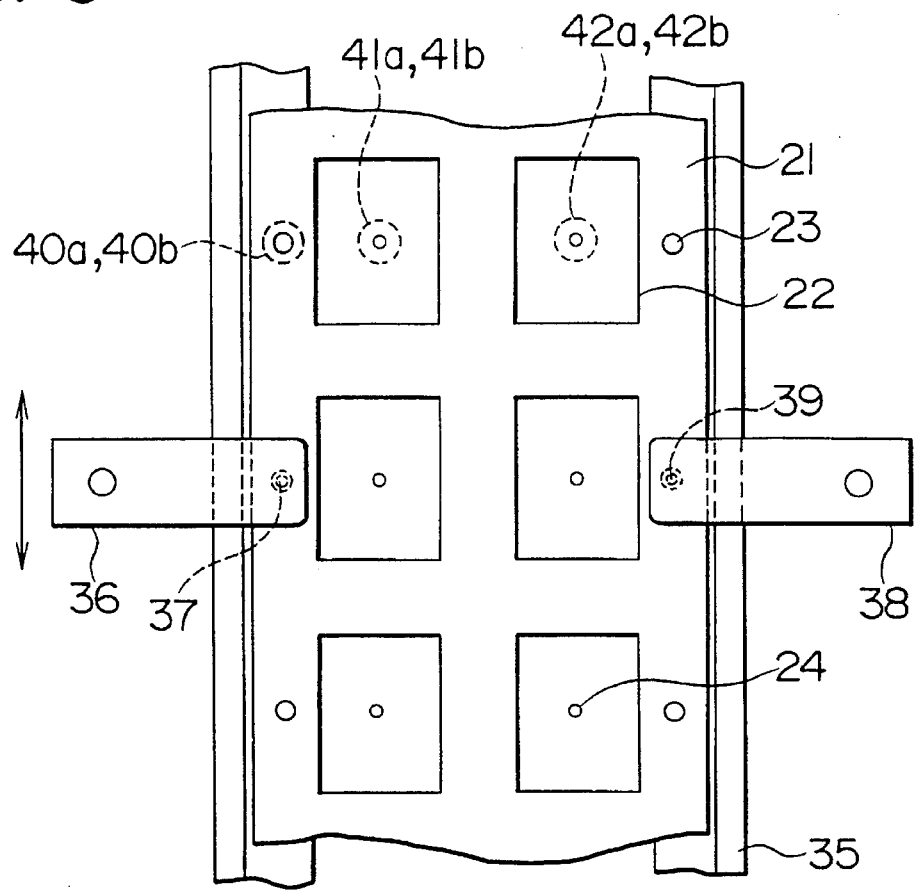

Then, a method of conveying the pallet 21 performed in the processing device 30 will now be described with reference to FIGS. 5 and 6. A pair of rails 35 on which the pallet 21 is placed and which guide the pallet 21 are arranged in the processing device 30. Furthermore, a conveying jig 36 for moving the pallet 21 is disposed adjacent to the rail 35. The conveying jig 36 can be vertically and horizontally moved along the rail 35 by a drive device (omitted from the illustration). A pin 37, which is received by the positioning holes 23 formed in the pallet 21, is fastened to the conveying jig 36. Furthermore, a positioning jig 38, vertically moved by a drive device (omitted from the illustration), is disposed adjacent to the rail 35. In addition, a pin 39, which is received by the positioning holes 23 formed in the pallet 21, is fastened to the positioning jig 38.

A light emitting device 40a and a photo-detector 40b are respectively disposed above and below the rail 35. When the pallet 21 is conveyed to a position at which a positioning hole 23 is positioned on an optical axis which connects the light emitting device 40a and the photo-detector 40b to each other, light emitted from the light emitting device 40a passes through the positioning hole 23 formed in the pallet 21 before it reaches the photo-detector 40b. As a result, the position of the positioning hole 23 can be detected. Furthermore, light emitting devices 41a and 42a and photo-detectors 41b and 42b are respectively disposed at the same positions as the light emitting device 40a and the photo-detector 40b when viewed in the lengthwise direction of the rail 35. When the positioning hole 23 formed in the pallet 21 reaches the position on the optical axis which connects the light emitting device 40a and the photo-detector 40b to each other, the optical axis connecting the light emitting device 41a and the photo-detector 41b to each other and the optical axis which connects the light emitting device 42a and the photo-detector 42b respectively pass through the IC detection holes 24 formed in the pallet 21. As a result, whether or not the IC is present in the pocket 22 can be detected.

When the pallet 21 is placed on the rail 35, the drive device (omitted from the illustration) moves the conveying jig 36 to make the positioning hole 23 formed in the pallet 21 receive the pin 37 before it moves the conveying jig 36 in the lengthwise direction of the rail 35. As a result, the pallet 21 is conveyed. When the positioning hole 23 formed in the pallet 21 is positioned below the light emitting device 40a by the conveyance of the pallet 21, light emitted from the light emitting device 40a is detected by the photo-detector 40b. When the above-described detection has been made, whether or not an IC is present in each of the pockets 22 is detected by the light emitting devices 41a and 42a and the photo-detectors 41b and 42b. The result of the detection, i.e. whether or not an IC is present as described above is stored by a memory or the like (omitted from the illustration).

After the pallet 21 has been conveyed for a distance which corresponds to one pitch of the positioning holes 23, the conveying jig 36 is restored to its original position. Then, the positioning jig 38 is moved and its pin 39 is thereby received by the positioning hole 23 formed in the pallet 21. As a result, the position of the pallet 21 is fixed. When the position of the pallet 21 has been fixed as described above, the IC accommodated in each of the pockets 22 of the pallet 21 is subjected to a predetermined process in accordance with the result of the detection made whether or not an IC is present. The process may be performed after the IC has been removed from the pallet 21 as described above. As an alternative to this, the IC may be subjected to the process in the pocket 22 of the pallet 21 depending upon the type of the process to be performed.

Figure 7:
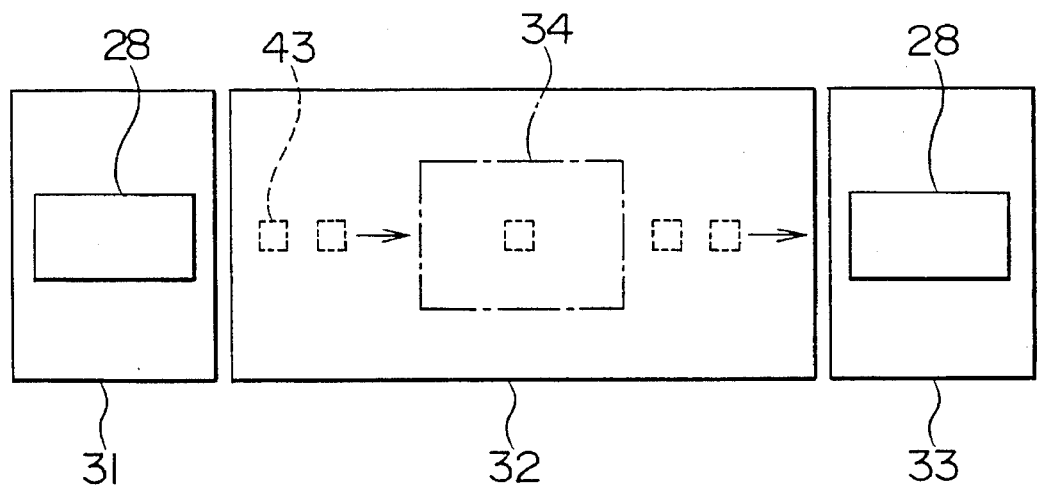
FIG. 7 is a schematic view which illustrates a manufacturing method according to a second embodiment of the present invention.

As shown in FIG. 7, another structure may be employed which is arranged in such a manner that ICs 43 in the cassette 28 are removed in the supply portion 31 of the processing devices so as to be sequentially supplied to the body portion 32 and processed in the processing portion 34. The ICs 43, which have been subjected to the process, are accommodated in the pallet 21 in the discharge portion 33 before they are placed in the cassette 28.

Figure 8C:
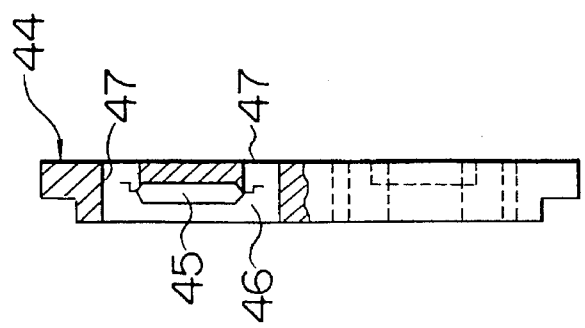
FIGS. 8a to 8c respectively are a plan view, a partially broken side elevational view and a partially broken end view which illustrate a pallet for use in the manufacturing method according to a third embodiment of the present invention.
Figure 8A:
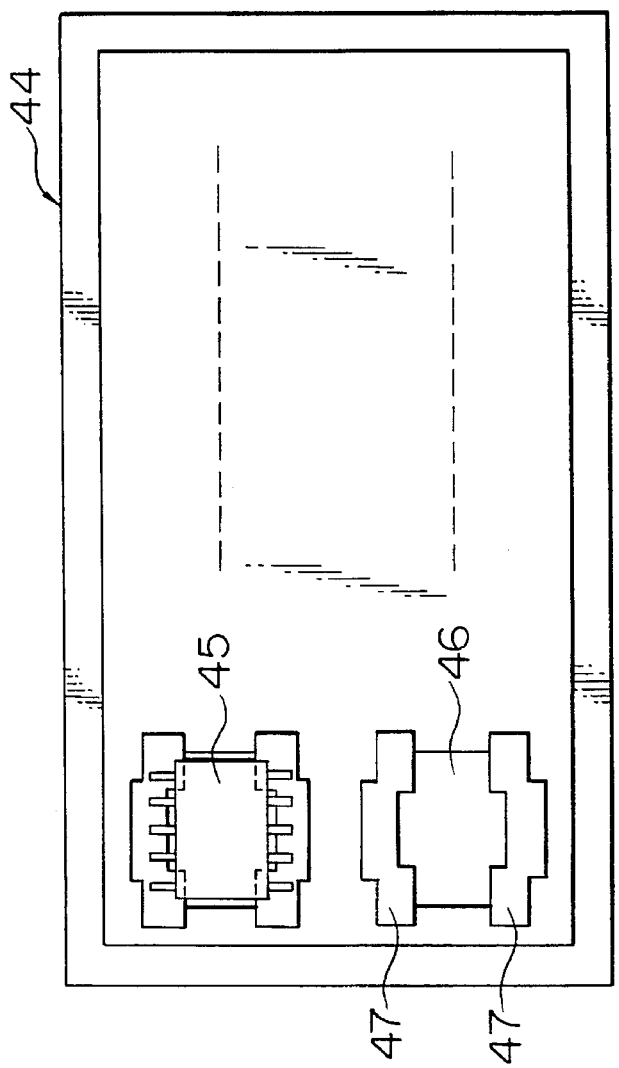
Figure 8B:
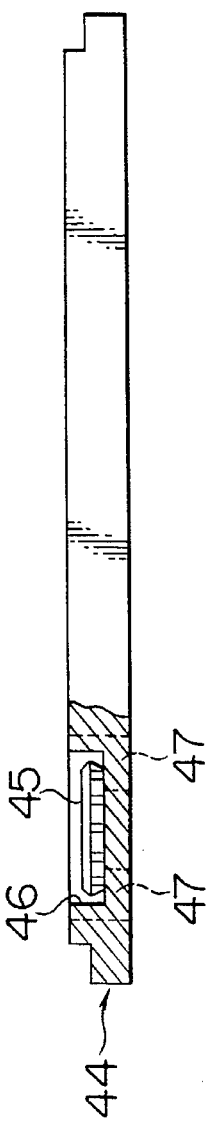
Figure 9:
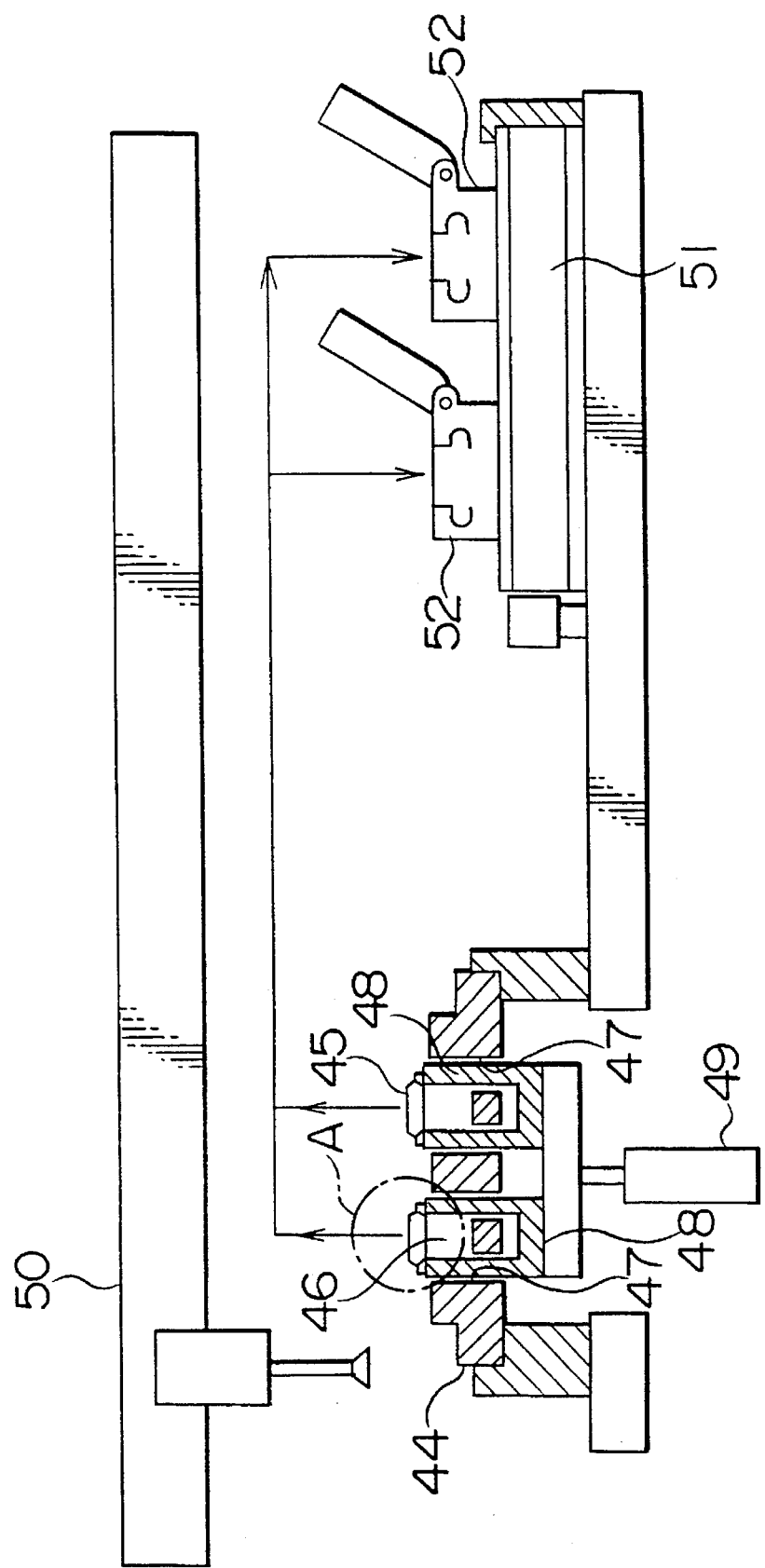
FIG. 9 is a cross sectional view which illustrates a third embodiment of the present invention.

The IC must be positioned at a desired position when it is processed. In this operation, if the IC can be accurately positioned in the pocket of the pallet, an excellent effect can be obtained in a case where the IC is subjected to the process on the pallet and as well as in a case where the IC is subjected to the process after it has been removed from the pallet. Then, a device for positioning the IC in the pocket of the pallet will now be described. A pallet 44 arranged as shown in FIGS. 8a to 8c is used. The pallet 44 has a plurality of pockets 46 which accommodate the ICs 45, each of the pockets 46 having a through hole 47 which is formed to reach the lower surface of the pallet 44. As shown in FIG. 9, a positioning rod 48 is, from the lower surface of the pallet 44, inserted into the insertion hole 47 formed in the pallet 44. The positioning rod 48 is vertically moved by a drive device 49 connected to it at a position below the pallet 44. As a result, the front portion of the positioning rod 48 is able to be into and retracted from the pocket 46 of the pallet 44.

Figure 10:
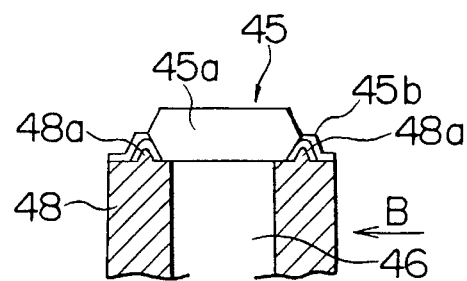
FIG. 10 is an enlarged view of the portion A shown in FIG. 9.
Figure 11:
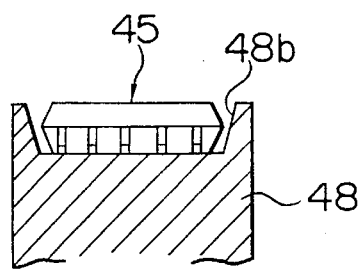
FIG. 11 is a view along arrow B of FIG. 10.
Figure 12A:
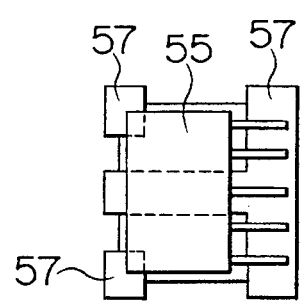
FIGS. 12a to 12c respectively illustrate pockets of a pallet according to a first modification to the third embodiment of the present invention.
Figure 12B:
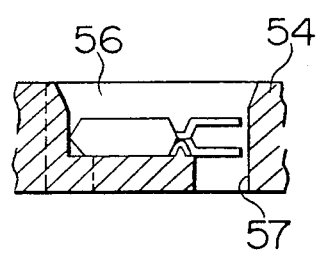
Figure 12C:
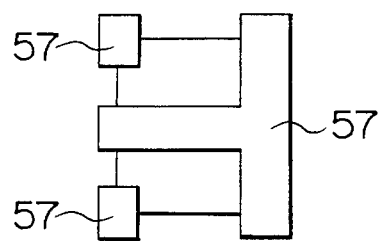
Figure 13A:
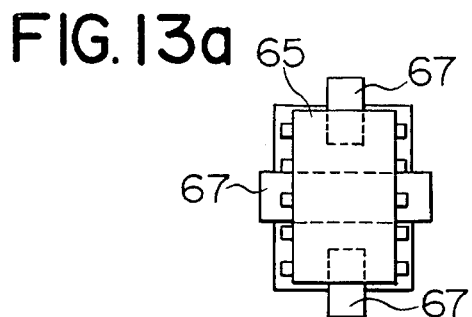
FIGS. 13a to 13c respectively illustrate pockets of a pallet according to a second modification to the third embodiment of the present invention.
Figure 14A:
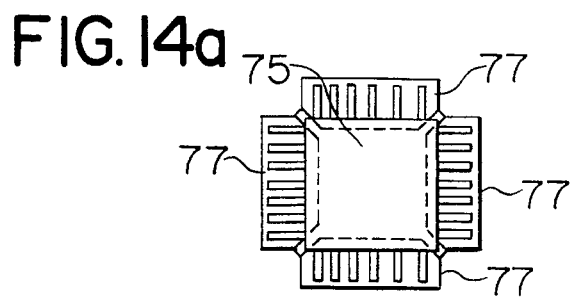
FIGS. 14a to 14c respectively illustrate pockets of a pallet according to a third modification to the third embodiment of the present invention.
Figure 13B:
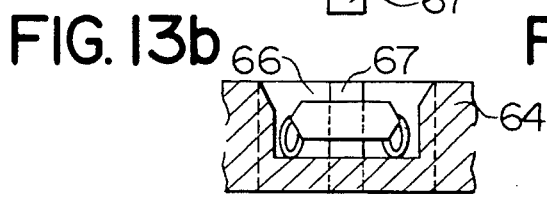
Figure 14B:
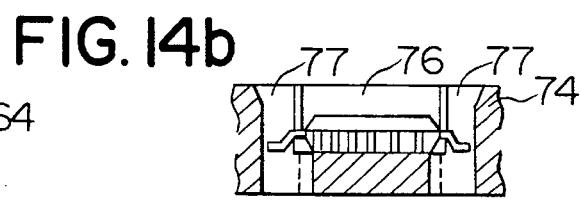
Figure 13C:
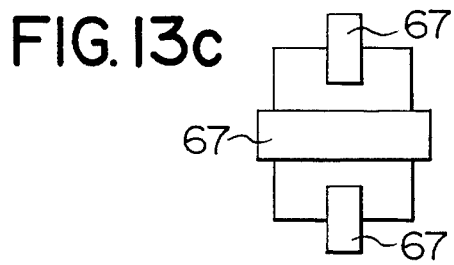
Figure 14C:
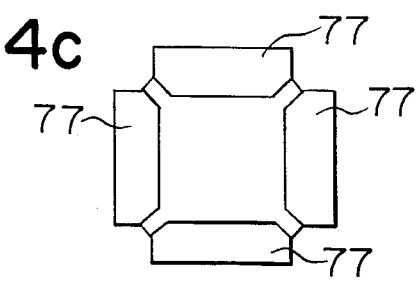
Figure 15A:
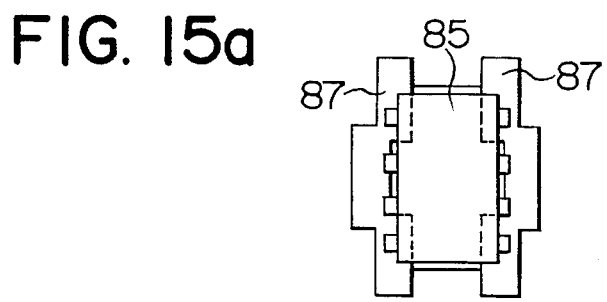
FIGS. 15a to 15c respectively illustrate pockets of a pallet according to a fourth modification to the third embodiment of the present invention.
Figure 15B:
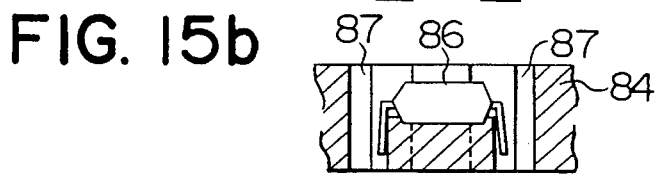
Figure 15C:
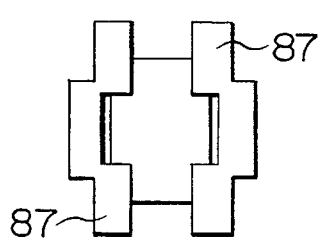

In a case where an SOP IC arranged as shown in FIG. 10 so that outer leads 45b outwardly extend from a resin package 45a is used, a projecting portion 48a is formed, for example, at the front portion of the positioning rod 48. As a result, when the positioning rod 48 has been raised to a position within the pocket 46, the above-described projecting portion 48a is received in a space between the package 45a of the IC 45 and the outer lead 45b. Therefore, widthwise directional positioning of the IC 45 can be made. As shown in FIG. 11, barrier portions 48b are formed at the front portion of the position rod 48 so that the lengthwise directional positioning of the IC 45 can be made. That is, when the positioning rod 48 has been moved upward and thereby it has supported the IC 45 in the pocket 46, the IC 45 can be accurately positioned.

The IC 45 thus-positioned is, for example as shown in FIG. 9, received by an vaccum lifter 50 from the pallet 44 before it is inserted into a socket 52 formed on a burn-in substrate 51 so that a burn-in process is performed. In a process such as a marking process performed by using a laser, the IC 45 may be subjected to the process when it is supported by the positioning rod 48 which has been moved upward in the pocket 46.

The present invention is not limited to the structure in which the SOP ICs are processed. The present invention can be adapted to a structure which processes other ICs if its pallet having the pockets and through holes which are adapted to the subject ICs and a positioning rod are used. For example, a ZIP, SOJ, QFP and DIP ICs 55, 65, 75 and 85 can be positioned by using corresponding pallets 54, 64, 74 and 84 as respectively shown in FIGS. 12a to 15c in such a manner that they are positioned on the above-described pallets. Referring to FIGS. 12a to 15c, reference numerals 56, 66, 76 and 86 represent pockets and 57, 67, 77 and 87 represent through holes.

What is claimed is:

1. A method of manufacturing a semiconductor device comprising:

disposing a packaged semiconductor device in a pocket of a pallet;

inserting a positioning rod from below the pallet into a through hole in the pocket to contact the packaged semiconductor device;

raising the packaged semiconductor device out of the pocket above the pallet with the positioning rod while contacting leads of the packaged semiconductor device with the positioning rod; and processing the packaged semiconductor device with a processing device.

2. The method according to claim 1 including inserting a projection of the positioning rod into a space between a body and a lead of the packaged semiconductor device.

3. The method according to claim 1 wherein raising the packaged semiconductor device comprises supporting the packaged semiconductor device on spaced-apart walls of the positioning rod.

4. The method according to claim 1 including maintaining an upper surface of a body of the packaged semiconductor device horizontal while raising it out of the pocket.

5. The method according to claim 1 wherein the packaged semiconductor device is supported by the positioning rod along an outer periphery of a body of the packaged semiconductor device, adjoining leads of the packaged semiconductor device, while the packaged semiconductor device is being raised.

6. The method according to claim 5 including stably supporting the packaged semiconductor device on the positioning rod while the packaged semiconductor device is being raised.

7. The method according to claim 6 including supporting an entire weight of the packaged semiconductor device on the positioning rod while raising the packaged semiconductor device.

8. The method according to claim 1 including disposing projecting barriers of the positioning rod opposite lengthwise ends of the packaged semiconductor device while raising the packaged semiconductor device to position the packaged semiconductor device lengthwise.

9. A method of manufacturing a semiconductor device comprising:

disposing a packaged semiconductor device in one of a plurality of pockets of a pallet;

inserting a positioning rod from below the pallet into through holes in one of the pockets to contact the packaged semiconductor device along an outer periphery of a body of the packaged semiconductor device;

raising the positioning rod to lift the packaged semiconductor device out of the one of the pockets above the pallet while supporting the packaged semiconductor device entirely on the positioning rod and while maintaining an upper surface of the body of the packaged semiconductor device horizontal; and processing the packaged semiconductor device with a processing device after the packaged semiconductor device is lifted out of the pocket.

10. The method according to claim 9 including contacting leads of the packaged semiconductor device with the positioning rod when raising the packaged semiconductor device.

11. The method according to claim 9 including inserting a projection of the positioning rod into a space between the body and a lead of the packaged semiconductor device.

12. The method according to claim 9 including simultaneously contacting the positioning rod against opposite widthwise sides of the packaged semiconductor device while raising the packaged semiconductor device.

13. The method according to claim 9 wherein raising the packaged semiconductor device comprises supporting the packaged semiconductor device on spaced-apart walls of the positioning rod.

14. The method according to claim 9 including disposing projecting barriers of the positioning rod opposite lengthwise ends of the packaged semiconductor device while raising the packaged semiconductor device to position the packaged semiconductor device lengthwise.

15. The method according to claim 1 including simultaneously contacting the positioning rod against opposite widthwise sides of the packaged semiconductor device while raising the packaged semiconductor device.

16. A method of manufacturing semiconductor devices comprising:

preparing first and second pallets having uniform outer dimensions including a width and a length, the first pallet having a plurality of pockets, the pockets in the first pallet each housing a first type of packaged semiconductor device, and the second pallet having a plurality of pockets, the pockets in the second pallet each housing a second type of packaged semiconductor device differing from the first type of packaged semiconductor device with respect to at least one of size and shape;

disposing each of a plurality of the first type of packaged semiconductor devices in a respective pocket of the first pallet and each of a plurality of the second type of packaged semiconductor devices in a respective pocket of the second pallet;

separately moving the first and second pallets along a path by a plurality of processing devices;

positioning each pallet in the vicinity of at least one of the processing devices;

inserting positioning rods from below each pallet into through holes in each pallet to raise each of the packaged semiconductor devices above the first and second pallets by contacting leads of the packaged semiconductor devices with the positioning rods; and processing each of the packaged semiconductor devices raised above its pallet with at least one of the processing devices.

17. The method according to claim 16 including inserting a projection of each positioning rod into a space between a body and a lead of one of the packaged semiconductor devices to position that packaged semiconductor device in a widthwise direction of its pallet.

18. A method according to claim 16 including positioning the first type of packaged semiconductor devices in the first pallet with leads of the first type of packaged semiconductor devices extending into the through holes of the first pallet.

19. A method as claimed in claim 16 including:

lowering the positioning rods to return each packaged semiconductor device to the respective pocket after the processing.

20. The method according to claim 16 including moving one of the pallets along the path by a pitch between adjacent positioning holes in the one of the pallets in a lengthwise direction of the one of the pallets, thereby sequentially moving each of the packaged semiconductor devices in the one of the pallets to an identical position with respect to one of the processing devices.

21. The method according to claim 16 including disposing the packaged semiconductor devices in pockets of the pallets with leads of the packaged semiconductor devices extending along widths of the first and second pallets.

22. The method according to claim 16 including moving the first and second pallets lengthwise along the path.

23. A method according to claim 16 including:

stopping each of the first and second pallets in the vicinity of a first of the processing devices;

processing the first and second types of packaged semiconductor devices at the first location with the first of the processing devices; and moving each pallet along the path from the first location after processing.

24. A method as claimed in claim 16 including disposing the packaged semiconductor devices in the first and second pallets in a plurality of parallel rows spaced along the width directions of the pallets.

* * * * *